United States Patent
Fang et al.

(10) Patent No.: US 9,761,568 B2
(45) Date of Patent: Sep. 12, 2017

(54) THIN FAN-OUT MULTI-CHIP STACKED PACKAGES AND THE METHOD FOR MANUFACTURING THE SAME

(71) Applicant: POWERTECH TECHNOLOGY INC., Hsinchu (TW)

(72) Inventors: Li-Chih Fang, Hsinchu (TW); Chia-Wei Chang, Hsinchu (TW); Kuo-Ting Lin, Hsinchu (TW); Yong-Cheng Chuang, Hsinchu (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 15/383,560

(22) Filed: Dec. 19, 2016

(65) Prior Publication Data
US 2017/0186737 A1    Jun. 29, 2017

(30) Foreign Application Priority Data

Dec. 23, 2015    (TW) .............................. 104143312 A

(51) Int. Cl.
*H01L 25/11* (2006.01)
*H01L 23/31* (2006.01)
(Continued)

(52) U.S. Cl.
CPC .......... *H01L 25/117* (2013.01); *H01L 21/304* (2013.01); *H01L 21/568* (2013.01); *H01L 23/3128* (2013.01); *H01L 23/3171* (2013.01); *H01L 24/09* (2013.01); *H01L 24/17* (2013.01); *H01L 25/50* (2013.01);
(Continued)

(58) Field of Classification Search
CPC ....... H01L 25/117; H01L 25/50; H01L 24/17; H01L 23/3171; H01L 24/09; H01L 21/304; H01L 23/3128; H01L 21/568
See application file for complete search history.

(56) References Cited

U.S. PATENT DOCUMENTS

| 6,621,155 B1 * | 9/2003 | Perino ................. H01L 23/3128 |
| | | 174/538 |
| 7,592,691 B2 * | 9/2009 | Corisis .............. H01L 23/49506 |
| | | 257/686 |

(Continued)

OTHER PUBLICATIONS

"Office Action of Taiwan Counterpart Application," issued on May 8, 2017, p1-p5, in which the listed reference was cited.

*Primary Examiner* — William Coleman
(74) *Attorney, Agent, or Firm* — Jianq Chyun IP Office

(57) ABSTRACT

A fan out type multi-chip stacked package includes a chip stacked assembly having a plurality of chips vertically stacked. The electrodes of the chips and one active surface among all active surfaces are not covered by the stacked chips. A plurality of flip-chip bumps of a dummy flip chip are coupled to the electrodes of the chips. An encapsulant encapsulates the chip stacked assembly and the flip-chip bumps. The encapsulant has a planar surface. The flip-chip bumps have a plurality of bonding surfaces exposed from and coplanar to the planar surface. A redistribution layer is disposed on the planar surface and includes a plurality of fan out circuits electrically connected the bonding surfaces of the flip-chip bumps. Thus, the package has better resistance against mold flow impact to effectively reduce the risk of wire sweeping.

19 Claims, 10 Drawing Sheets

(51) Int. Cl.
*H01L 23/00* (2006.01)
*H01L 25/00* (2006.01)
*H01L 21/56* (2006.01)
*H01L 21/304* (2006.01)

(52) U.S. Cl.
CPC ........ *H01L 2224/0401* (2013.01); *H01L 2224/13025* (2013.01); *H01L 2225/06548* (2013.01); *H01L 2225/06562* (2013.01)

(56) References Cited

U.S. PATENT DOCUMENTS

| | | | |
|---|---|---|---|
| 8,049,339 B2 * | 11/2011 | Fan | H01L 24/49 257/668 |
| 8,178,978 B2 * | 5/2012 | McElrea | H01L 24/24 257/676 |
| 8,525,349 B2 * | 9/2013 | Song | H01L 22/32 257/686 |
| 8,937,381 B1 | 1/2015 | Dunlap et al. | |
| 2016/0118333 A1 * | 4/2016 | Lin | H01L 24/97 257/773 |

\* cited by examiner

THIN FAN-OUT MULTI-CHIP STACKED PACKAGES AND THE METHOD FOR MANUFACTURING THE SAME

FIELD OF THE INVENTION

The present invention relates to a semiconductor package and more specifically to a fan out multi-chip stacked packages and the method for manufacturing the same.

BACKGROUND OF THE INVENTION

In conventional multi-chip stacked packages, a plurality of semiconductor chips are individually and vertically stacked on a substrate with the active surfaces of the chips facing upward. The chips are electrically connected to the substrate through a plurality of bonding wires formed by wire bonding process. However, the thickness of the conventional multi-chip stacked package includes the substrate thickness and the encapsulation thickness, the encapsulation thickness being greater than the loop height of the bonding wires. In this way, the package thickness are not effectively reduced, especially for some conventional packages having longer and higher bonding wires which are vulnerable to wire sweeping leading to electrical short during the deposition of the encapsulant.

SUMMARY OF THE INVENTION

The main purpose of the present invention is to provide a fan out multi-chip stacked package having reduced thickness and the method for manufacturing the same.

An embodiment of the present invention presents a fan out multi-chip stacked package. The package includes a plurality of chips, a plurality of flip-chip bumps, an encapsulant, and a redistribution layer. The plurality of chips are stacked over each other. At least one electrode of each of the plurality of chips and an active surface of a top chip is exposed after stacking of the plurality of chips. The plurality of flip-chip bumps are each coupled to an electrode of a chip of the plurality of chips. Each of the plurality of flip-chip bumps is a part of a dummy flip chip of at least one dummy flip chip. The encapsulant encapsulates the plurality of chips and the plurality of flip-chip bumps. A part of the encapsulant and a body of one of the at least one dummy flip chip is removed during a grinding process to form a planar surface. The redistribution layer is disposed on the planar surface. The redistribution layer includes a plurality of conductive paths electrically coupled to the plurality of flip-chip bumps.

Another embodiment of the present invention presents a manufacturing method of a fan out multi-chip stacked package. The method includes disposing a chip stacked assembly on a temporary carrier, disposing at least one dummy flip chip to the chip stacked assembly, forming an encapsulant over the temporary carrier, grinding the encapsulant, disposing a redistribution layer on the encapsulant, and removing the temporary carrier. The chip stacked assembly comprises a plurality of chips. Each of the plurality of chips having an active surface and at least one electrode disposed on the active surface. The electrodes of the chips and an active surface of a top chip are exposed on the chip stacked assembly. The at least one dummy flip chip includes a plurality of flip-chip bumps coupled to the electrodes. The encapsulant encapsulates the chip stacked assembly and the plurality of flip-chip bumps. A planar surface of the encapsulant is formed during the grinding process. A body of a dummy flip chip of the at least one dummy flip chip is removed during the grinding process. Thus, at least a part of the plurality of flip-chip bumps each has a corresponding bonding surface exposed from and coplanar to the planar surface. The redistribution layer has a plurality of fan out circuits electrically connected to the bonding surfaces.

DETAILED DESCRIPTION OF THE INVENTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios may be selectively designed and disposed and the detail component layouts may be more complicated.

Figure 1:
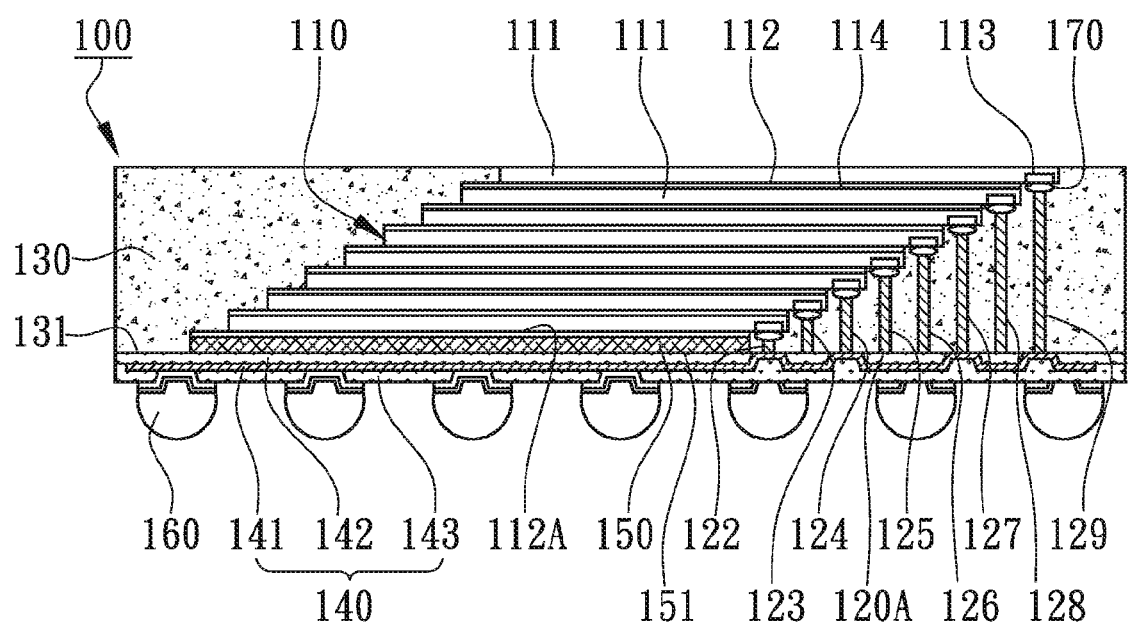
FIG. 1 is a cross-sectional view of a fan out multi-chip stacked package according to the first embodiment of the present invention.

According to an embodiment of the present invention, a cross-sectional view of a fan out multi-chip stacked package 100 is illustrated in FIG. 1. FIG. 2A to FIG. 2G illustrates cross-sectional views of the components during the manufacturing process of the fan out multi-chip stacked package 100. FIG. 3 illustrates a cross-sectional view of a first dummy flip chip 120 utilized in the process of FIG. 2B. The fan out multi-chip stacked package 100 comprises a chip stacked assembly 110, a plurality of first flip-chip bumps 122 to 129 separated from a first body 121 of a first dummy flip chip 120 as shown in FIG. 2B and FIG. 3, an encapsulant 130, and a redistribution layer 140.

The chip stacked assembly 110 comprises a plurality of stacked chips 111, the chips 111 may be semiconductor devices such as memory. Each chip 111 may have an active surface 112 and a plurality of electrodes 113 disposed on the active surface 112. The plurality of electrodes 113 may be exposed after the chips 111 are stacked on top of each other. An active surface 112A of one of the chips 111 may be exposed in the chip stacked assembly 110. The active surface 112 of a chip 111 may be the surface of a wafer where fabrication process is performed and the electrodes 113 are the external terminals electrically connected to the metal circuitry (not shown in the figure) of the internal circuit of the chip 111. A die-attach layer 114 may be disposed between two adjacent chips 111 and may be configured to adhere the chips 111 to form the chip stacked assembly 110. The total thickness of a single chip and a die-attach layer may be referred to as a unit thickness of the stacked chips 111. The method of stacking the chips 111 may be stair-like stacking, cross stacking, or pyramid stacking. In an embodiment of the present invention, the chips 111 are stacked using the stair stacking method. The electrodes 113 of each chip 111 are exposed in the chip stacked assembly 110. The electrodes 113 may be disposed on a peripheral area of the active surface 112 of a chip 111. The active surface 112 of the chips 111 may be facing the same direction.

a plurality of the first flip-chip bumps 122 to 129 may be separated from the first body 121 of the first dummy flip chip 120 after being coupled to the chip stacked assembly 110. The first flip-chip bumps 122 may be coupled to the electrodes 113 of the active surface 112A. And, the remaining first flip-chip bumps 123 to 129 are correspondingly coupled to the electrodes 113 of the active surfaces 112 only partially exposed in the chip stacked assembly 110. The first flip-chip bumps 122 to 129 disposed in the same chip may have the same height. The first flip-chip bumps 122 to 129 disposed in different chips may have different heights. The material used to couple the first flip-chip bumps 122 to 129 to the corresponding electrodes 113 may be solder paste 170 such as Tin-Silver solder (SnAg). The height of the first flip-chip bumps 122 to 129 in the same row may be equal to each other. And, the height of the first flip-chip bumps 122 to 129 the same column may be varying from each other. The first flip-chip bumps 122 may be the bumps in the first row, the first flip-chip bumps 123 may be the bumps in the second row, and so on. Thus, the first flip-chip bumps 129 may be the bumps in the eighth row. The bumps in the same row may correspond to the electrodes 113 of a chip 111. The materials used to form the first flip-chip bumps 122 to 129 are metals with high conductivity such as copper or gold. The first flip-chip bumps 122 to 129 may be fabricated through electroplating, coating, forming of copper pillar, or wire bonding. But, the fabrication process of the flip-chip bumps is not limited to the above mentioned processes. The difference in height between two rows of first flip-chip bumps 122 to 129 may be equal to one unit thickness of the stacked chips 111. For example, the difference between the height of a first row of the first flip-chip bumps 122 and a second row of the first flip-chip bumps 123 may be equal to one unit thickness.

As shown in FIG. 1, the encapsulant 130 encapsulates the chip stacked assembly 110 and the first flip-chip bumps 122 to 129. The encapsulant 130 may be a thermosetting isolation material including resin or epoxy. Furthermore, the encapsulant 130 has a planar surface 131 adjacent to the exposed active surface 112A. The first body 121 of the dummy flip chip 120 is removed (as shown in FIG. 2D and FIG. 2E) to form a bonding surface 120A for each of the first flip-chip bumps 122 to 129. The bonding surfaces 120A may be exposed through and coplanar to the planar surface 131 of the encapsulant 130. The exposed active surface 112A is not exposed through the planar surface 131. The active surface 112A may be covered by the encapsulant 130 or a spacer 150 may be disposed on the active surface 112A having the electrodes 113 of the active surface 112A not covered by the spacer 150. The thickness of the encapsulant 130 may be less than or equal to 1.2 times of the stacking height of the chip stacked assembly 110.

As shown in FIG. 1, the redistribution layer 140 is disposed on the planar surface 131 of the encapsulant 130. The redistribution layer 140 includes a plurality of fan out circuits 141 electrically connecting the bonding surfaces 120A of the first flip-chip bumps 122 to 129. The redistribution layer 140 may further include a first passivation layer 142 and a second passivation layer 143. The first passivation layer 142 may be formed over the planar surface 131. The fan out circuits 141 may be disposed between the first passivation layer 142 and the second passivation layer 143. The fan out circuits 141 may not be directly disposed on the planar surface 131. Parts of the fan out circuits 141 used to form electrical connection with the chip stacked assembly 110 may be directly coupled to the corresponding bonding surfaces 120A. The redistribution layer 140 may be fabricated by semiconductor deposition, electroplating, and etching process and equipment. The structure of the fan out circuits 141 may be formed by a combination of multiple metal layers such as titanium/copper/copper (Ti/Cu/Cu), titanium/copper/copper/nickel/gold (Ti/Cu/Cu/Ni/Au), etc. The first copper layer may have a thickness of 0.2 μm and may be fabricated using sputtering or PVD deposition process. The second copper layer is may have a thickness of 3 μm and may be fabricated through electroplating process. The trace thickness of the fan out circuits 141 may be controlled to have a thickness less than 10 μm, ranging from 2~6 μm. The structures of the first passivation layer 142 and the second passivation layer 143 are organic isolation layers such as polyimide (PI). The thickness of the first passivation layer 142 and the second passivation layer 143 may be 5 μm. Therefore, thickness and circuit density of the redistribution layer 140 presents an improvement over the trace layer of the conventional substrates. When a plurality of opening are formed on the first passivation layer 142 to expose the bonding surfaces 120A of the first flip-chip bumps 122 to 129, the deposited metal layers of the fan out circuits 141 may electrically connect to the bonding surfaces 120A of the first flip-chip bumps 122 to 129. In this way layers of the circuitry may be reduced and the electroplating process for the through holes of a substrate may be eliminated.

As shown in FIG. 1, the fan out multi-chip stacked package 100 may further comprise a plurality of external terminals 160 such as solder balls coupled to the redistribution layer 140 to electrically connect the fan out multi-chip stacked package 100 to an external circuit.

As shown in FIG. 1, the fan out multi-chip stacked package 100 may further comprise a spacer 150 disposed on active surface 112A. The spacer 150 may be a polished plate. of the polished plate may be a dummy chip and a metal plate. The spacer 150 has a ground surface 151 coplanar to the planar surface 131. The first passivation layer 142 may further cover the ground surface 151. The spacer 150 is used to ensure the active surface 112A is adjacent to but not coplanar to the planar surface 131 of the encapsulant 130 and to avoid grinding damage on the active surface 112A.

FIG. 3 is a cross-sectional view illustrating the first dummy flip chip 120 used in the process shown in FIG. 2B. The first dummy flip chip 120 includes the first body 121 and a plurality of the first flip-chip bumps 122 to 129 protruding from the first body 121. The first body 121 may be chosen from the group consisting of a dummy chip and a metal plate. The height difference between two adjacent rows of the first flip-chip bumps 122 to 129 is approximately equal to one unit thickness of the stacked chips 111.

The spacing and the height of the flip-chip bumps on the dummy flip chip 120 may be predesigned and fabricated before being mounted through flip-chip to the corresponding bonding pads of the chips 111 with different stacked heights to electrically connect the chips and the redistribution layer. The pitch of the flip-chip bumps is fixed to avoid wire sweeping during the molding process to form the encapsulant 130. The formation of conventional vertical bonding wires by wire-bonding method requires extra wire-cutting space. The cutting lengths of the vertical bonding wires have larger length differences. Moreover, top ends of the vertical bonding wires are suspending which are vulnerable for wire sweeping during molding process.

The manufacturing method of the fan out multi-chip stacked package 100 is illustrated in detail from FIG. 2A to FIG. 2G.

Figure 2A:
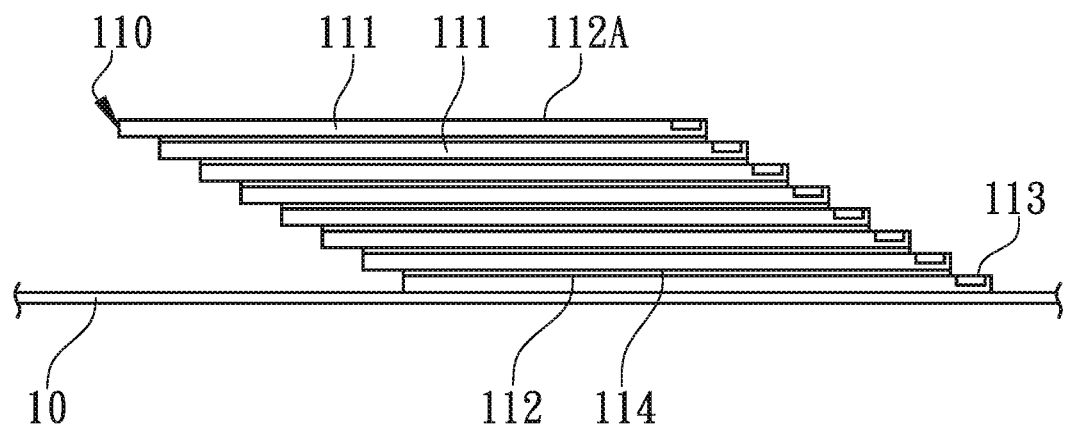
FIGS. 2A to 2G are cross-sectional views illustrating the components shown in a plurality of major processing steps of manufacturing the fan out multi-chip stacked package according to the first embodiment of the present invention.
Figure 2B:
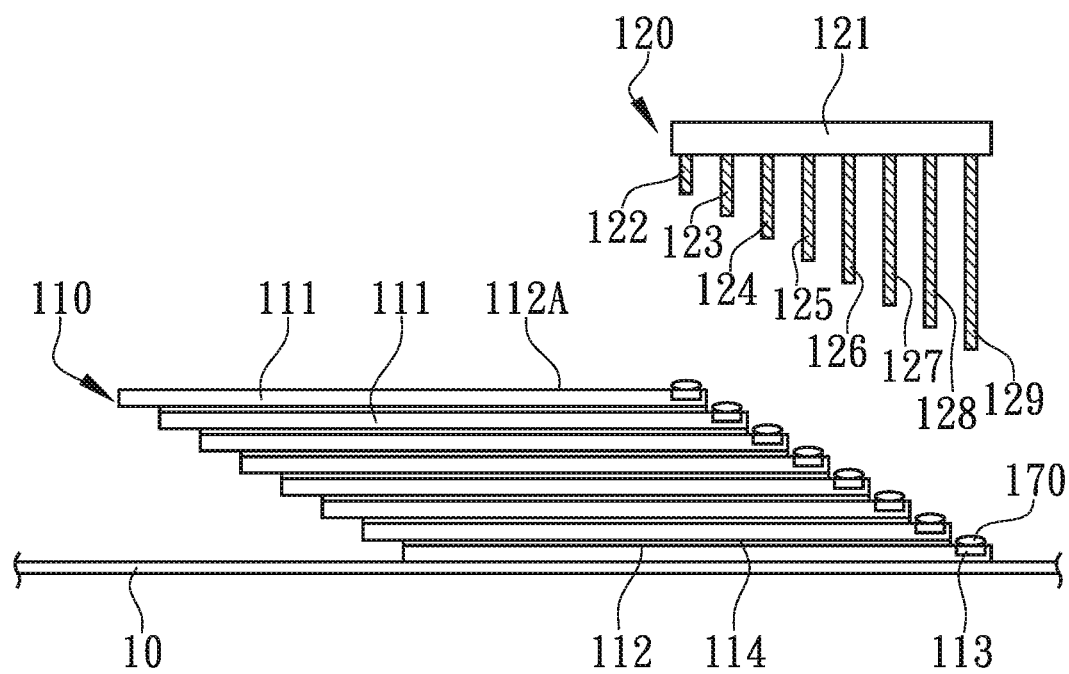
Figure 3:
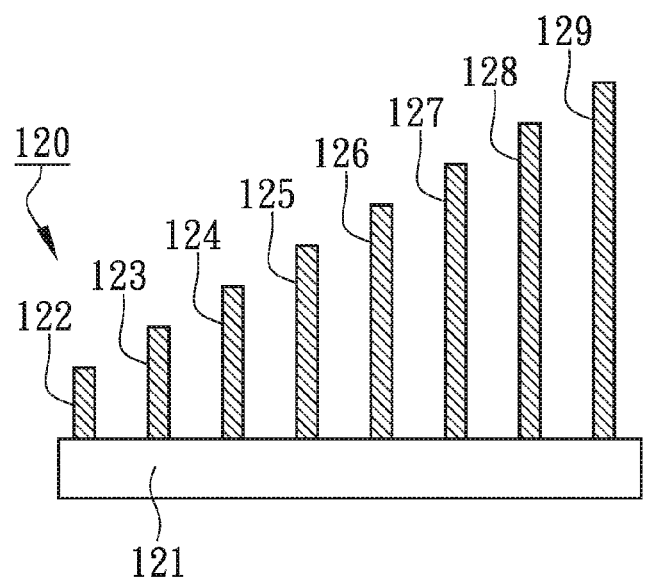
FIG. 3 is a cross-sectional view illustrating a first dummy flip chip utilized in the corresponding step of FIG. 2B according to the first embodiment of the present invention.

As shown in FIG. 2A, a chip stacked assembly 110 is provided and disposed on a temporary carrier 10 by a pick-and-place process. The chip stacked assembly 110 comprises a plurality of stacked chips 111. Each chip 111 has an active surface 112 and a plurality of electrodes 113 disposed on the active surface 112. The electrodes 113 are exposed after the chips 111 are stacked on top of each other. An active surface 112A of the top chip 111 of the chip stacked assembly 110 may not covered be covered by another chip 111. The active surfaces 112 are facing away from a temporary carrier 10 during chip stacking processes. The chips 111 may be stacked in a stair-like staggered structure with the electrodes 113 of the chips being exposed. The electrodes 113 may include a plurality of bonding pads disposed on a peripheral area of the corresponding active surface 112. The temporary carrier 10 may be an adhesive tape, an adhesive wafer carrier, or an adhesive panel carrier. When a plurality of chip stacked assembly 110 may be disposed on the temporary carrier 10 simultaneously, each chip stacked assembly 110 is may represent a chip unit in a wafer or a panel during wafer-level or panel-level packaging process.

Figure 2C:
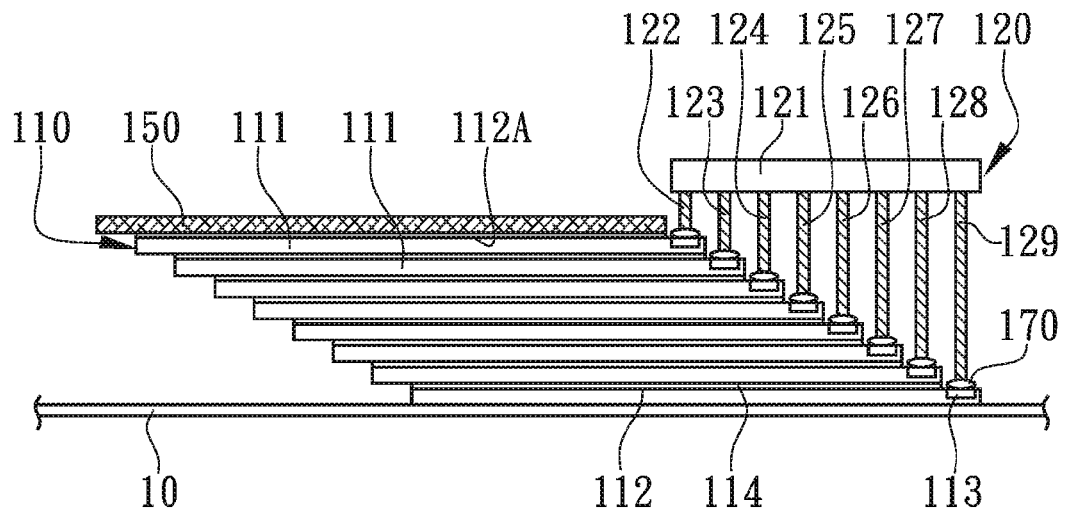
Figure 2D:
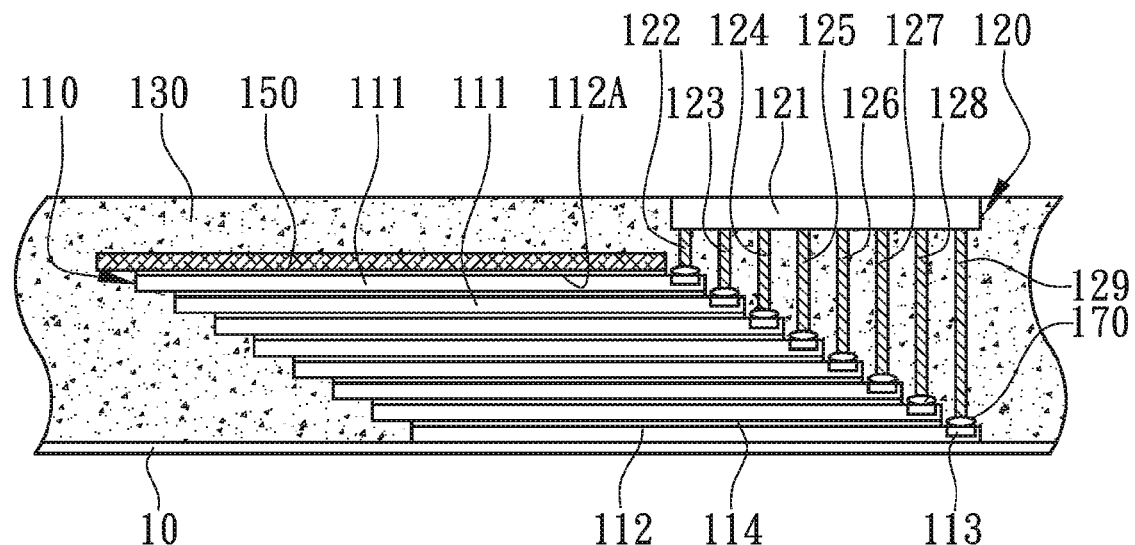
Figure 2E:
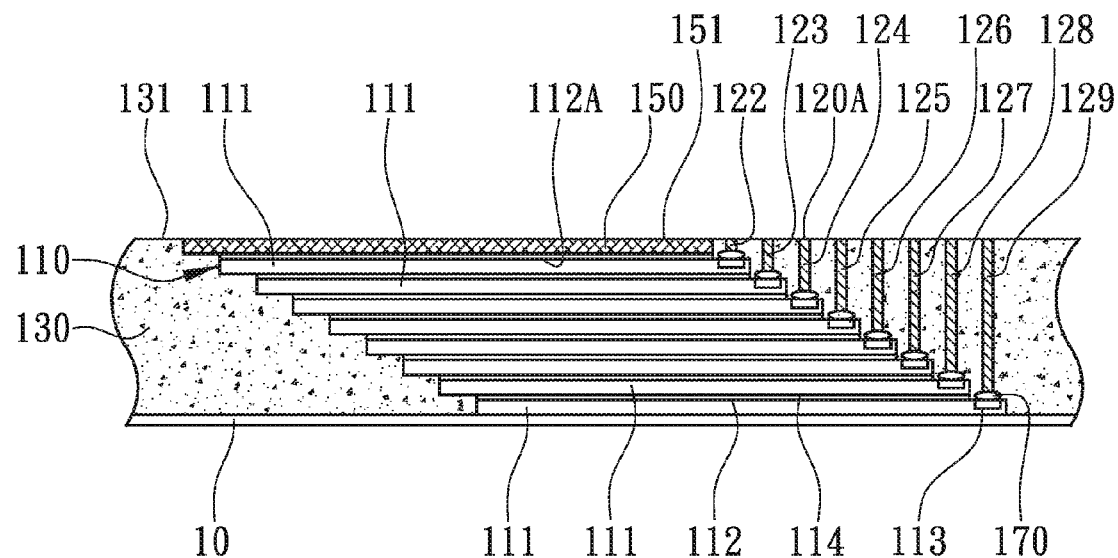

As shown in FIG. 2B, FIG. 2C, and FIG. 3, a first dummy flip chip 120 is disposed on the chip stacked assembly 110 using a flip-chip bonding process. The first flip-chip bumps 122 of the first dummy flip chip 120 are coupled to the electrodes 113 of the active surface 112A. The first flip-chip bumps 123 to 129 are correspondingly coupled to the electrodes 113 on the active surface 112 of the chips 111 having active surfaces at least partially covered in the chip stacked assembly 110. The coupling material of the first flip-chip bumps 122 to 129 may include solder paste 170. The first flip-chip bumps 122 to 129 include a plurality of vertically conductive pillars. There is a variation in the height of the first flip-chip bumps 122 to 129. The height of the first flip-chip bumps 122 to 129 may dependent on the tacked height of the corresponding chip 111 where the first flip-chip bumps 122 to 129 may be coupled to. The height difference between two adjacent first flip-chip bump 122 to 129 may be substantially equal to a unit thickness of the stacked chips 111. Furthermore, as shown in FIG. 2C, after providing a chip stacked assembly 110 and before forming the encapsulant 130, a spacer 150 may be disposed on the active surface 112A. The spacer 150 may be a plate such as a dummy chip or a metal plate.

As shown in FIG. 2D, an encapsulant 130 is formed on the temporary carrier 10 through a compression molding process or through a transfer molding process. The encapsulant 130 encapsulates the chip stacked assembly 110 and the first flip-chip bumps 122 to 129. The encapsulant 130 may further encapsulate the first body 121 of the first dummy flip chip 120.

As shown in FIG. 2E, a grinding process is performed on the encapsulant 130 to form a planar surface 131 adjacent to the said uncovered active surface 112A. The grinding process may be a wafer level grinding process or a panel level grinding process wherein the first body 121 of the first dummy flip chip 120 is removed completely and a part of each of the first flip-chip bumps 122 to 129 are exposed from to form a plurality of bonding surfaces 120A and each of the plurality of bonding surfaces 120A may be coplanar to the planar surface 131. After the grinding process of the encapsulant 130, a ground surface 151 of the spacer 150 may be exposed and may be coplanar to the planar surface 131. A portion of the spacer 150 may be removed during the grinding process. Thus, the active surface 112A is prevented from receiving grinding damage.

Figure 2F:
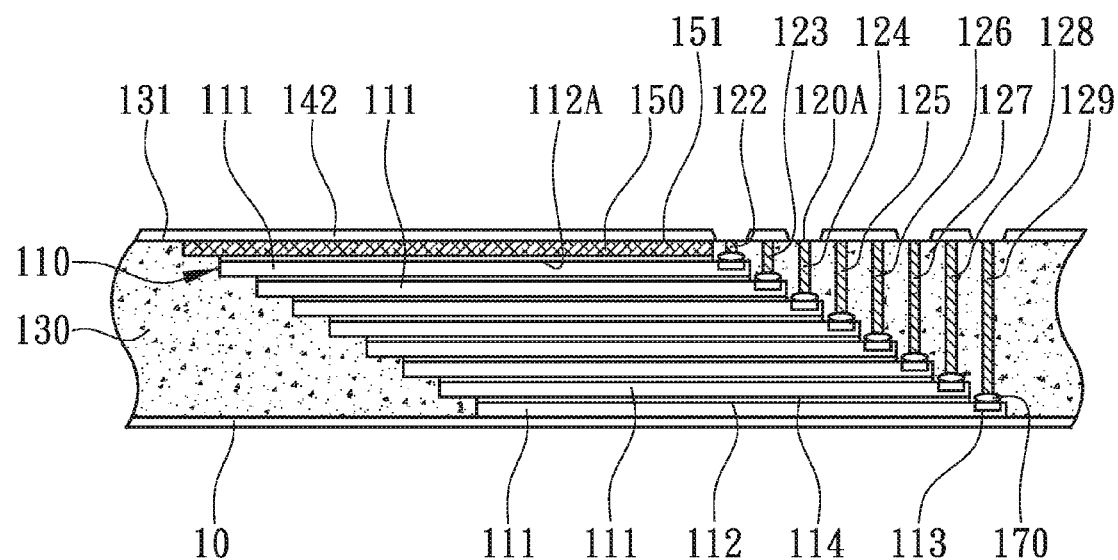
Figure 2G:
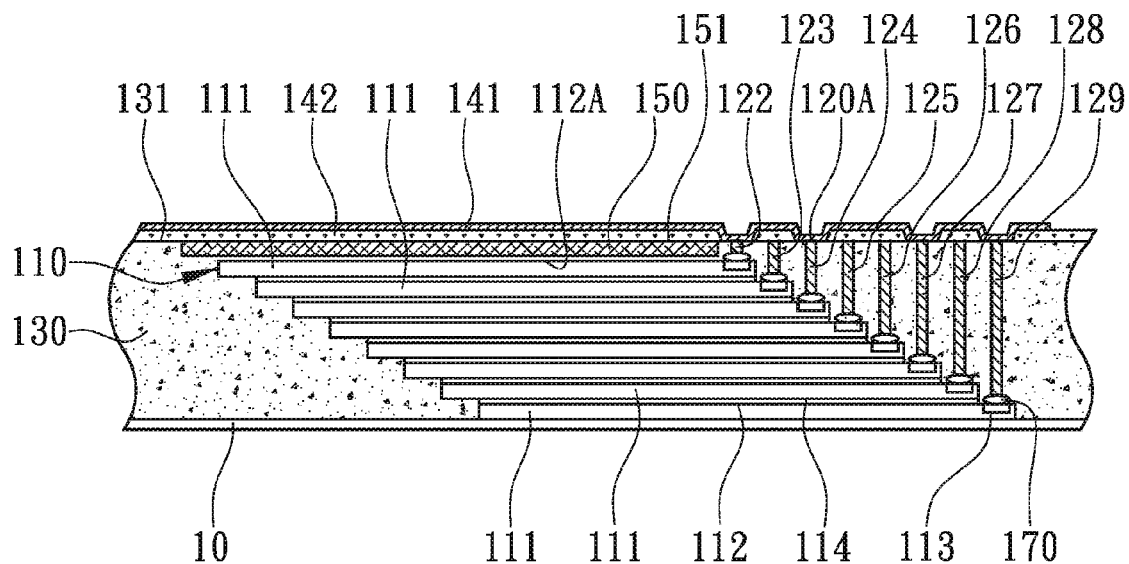

As shown in FIG. 2F and FIG. 2G, a redistribution layer 140 is formed on the planar surface 131 by polyimide deposition process and RDL deposition process. As shown in FIG. 1, the redistribution layer 140 includes a plurality of fan out circuits 141 electrically coupled to the bonding surfaces 120A of the first flip-chip bumps 122 to 129. The redistribution layer 140 further includes a first passivation layer 142 and a second passivation layer 143. As shown in FIG. 2F, the first passivation layer 142 covers the planar surface 131 and has a openings to expose the bonding surfaces 120A of the first flip-chip bumps 122 to 129. The first passivation layer 142 may further cover the ground surface 151 of the spacer 150. The fan out circuits 141 are disposed on the first passivation layer 142 to electrically connect to the bonding surfaces 120A of the first flip-chip bumps 122 to 129. The fan out circuits 141 may be further covered by the second passivation layer 143. After the disposition of the redistribution wiring mechanism 140, a plurality of external terminals 160 are bonded onto the redistribution layer 140 to electrically connect to the fan out circuits 141. After the singulation process and the removal of the temporary carrier 10, a plurality of individual fan out multi-chip stacked packages 100 as shown in FIG. 1 are formed.

Figure 4:
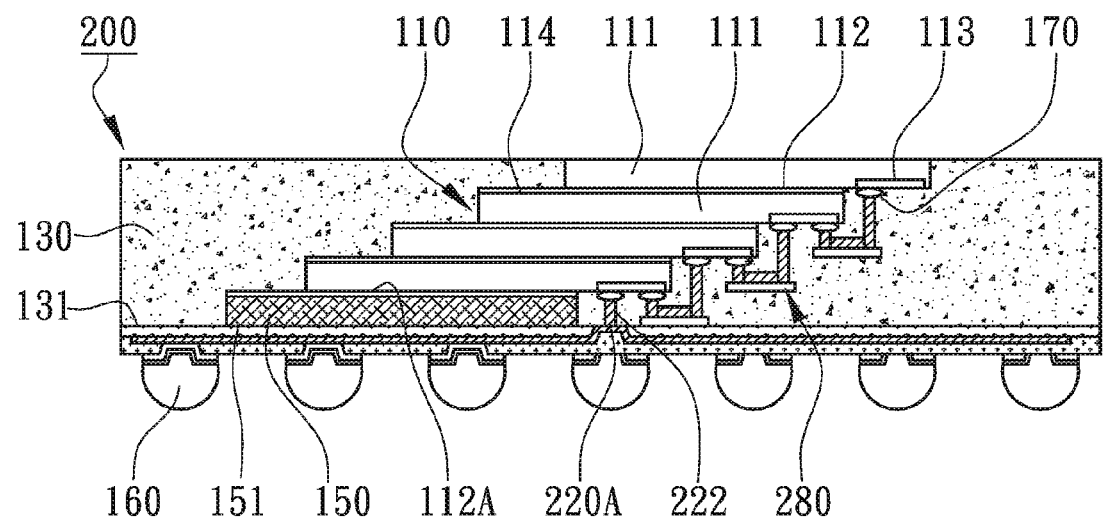
FIG. 4 is a cross-sectional view of another fan out multi-chip stacked package according to the second embodiment of the present invention.

A cross-sectional view of a fan out multi-chip stacked package 200 according to a second embodiment is illustrated in FIG. 4. FIG. 5A to FIG. 5E are cross-sectional views illustrating the process of manufacturing the fan out multi-chip stacked package 200. FIG. 6 illustrates a cross-sectional view of a second dummy flip chip 280 utilized in FIG. 5B. The fan out multi-chip stacked package 200 comprises a chip stacked assembly 110, a plurality of the third flip-chip bumps 222 separated from the third dummy flip chip 220 (as shown in FIG. 5B), an encapsulant 130 and a redistribution wiring mechanism 140. The fan out multi-chip stacked package 200 further comprises at least one second dummy flip chip 280 including a plurality of second flip-chip bumps 282, 283 mounted onto the chip stacked assembly 110. The second dummy flip chip 280 may further include a second body 281. Therein, the second flip-chip bumps 282, 283 are disposed on and extruding from the second body 281.

The chip stacked assembly 110 comprises essentially of a plurality of stacked chips 111. Each chip 111 has an active surface 112 and a plurality of electrodes 113 disposed on the active surface 112. Therein, the electrodes 113 are not covered in the chip stacked assembly 110. One active surface 112A among all of the active surfaces 112 is also not covered by the stacked chips 111.

As shown in FIG. 4, the third flip-chip bumps 222 of the third dummy flip chip 220 are at least coupled to the electrodes 113 of the active surface 112A. The second flip-chip bumps 282, 283 of the second dummy flip chip 280 are coupled to the corresponding electrodes 113 on the covered active surfaces 112 of the chips 111. The coupling material between the flip-chip bumps 222, 282, 283 and the electrodes 113 may include solder paste 170. The second dummy flip chip 280 may further include a plurality of conductive traces 284 laterally disposed on the second body 281 (as shown in FIG. 5C and FIG. 6) to electrically connect the flip-chip bumps 282, 283. The third flip-chip bumps 222 and the second flip-chip bumps 282, 283 may be conductive pillars. Therein, the second flip-chip bumps 282, 283 may have a height difference between rows of the second flip-chip bumps 282, 283. The height difference may be equal to a unit thickness of the stacked chip 111.

As shown in FIG. 4, the encapsulant 130 encapsulates the chip stacked assembly 110 and the third flip-chip bumps 222. The encapsulant 130 has a planar surface 131 adjacent to the active surface 112A. That the third body 221 of the third dummy flip chip 220 may be removed completely and the third flip-chip bumps 222 may have a plurality of bonding surfaces 220A exposed from and coplanar to the planar surface 131. Moreover, the encapsulant 130 may further encapsulate the second body 281 of the second dummy flip chip 280 and the second pillars bumps 282, 283.

As shown in FIG. 4, the redistribution wiring mechanism 140 is disposed on the planar surface 131. The redistribution wiring mechanism 140 includes a plurality of fan out circuits 141 connecting to the bonding surfaces 120A of the third flip-chip bumps 222. The redistribution wiring mechanism 140 may further include a first passivation layer 142 and a second passivation layer 143 disposed on the first passivation layer 142. The first passivation layer 142 is formed over the planar surface 131, and the fan out circuits 141 are disposed between the first passivation layer 142 and the second passivation layer 143. Furthermore, the fan out multi-chip stacked package 200 may further comprise a plurality of external terminals 160 coupled to the redistribution wiring mechanism 140 and electrically connected to the fan out circuits 141.

As shown in FIG. 4, the fan out multi-chip stacked package 200 may further comprise a spacer 150 disposed between the planar surface 131 and the active surface 112A. The spacer 150 is a polished plate chosen from the group consisting of a dummy chip and a metal plate. Therein, the spacer 150 has a ground surface 151 coplanar to the planar surface 131. The first passivation layer 142 may cover at least a portion of the ground surface 151. Some of the first flip-chip bumps 222 of the first dummy flip chip 220 may be coupled to the spacer 150 as shown in FIG. 5B. To protect the active surface 112A, the spacer 150 is further configured for fixing the first dummy flip chip 120 during the molding process to form the encapsulant 130 as shown in FIG. 5C.

A cross-sectional view of the second dummy flip chip 280 is illustrated in FIG. 6. The second dummy flip chip 280 may be implemented in a fan out multi-chip stacked package 200. The second body 281 of the second dummy flip chip 280 may be a dummy chip and a metal plate. The second flip-chip bumps 282, 283 have a height difference between rows of the second flip-chip bumps 282, 283. Therein, the height difference is substantially equal to a unit thickness of the stacked chips 111. Moreover, the second dummy flip chip 280 may further include a plurality of conductive traces 284 disposed on the second body 281 to electrically connect to the second flip-chip bumps 282, 283 to each other.

The manufacturing processes of the fan out multi-chip stacked package 200 are described from FIG. 5A to FIG. 5E as follows.

Figure 5A:
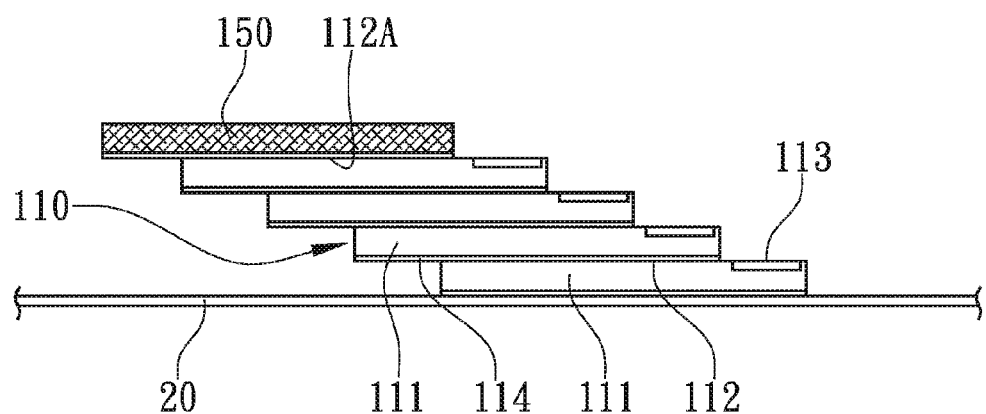
FIGS. 5A to 5E are cross-sectional views illustrating the components shown in a plurality of major processing steps for manufacturing the fan out multi-chip stacked package according to the second embodiment of the present invention.
Figure 5B:
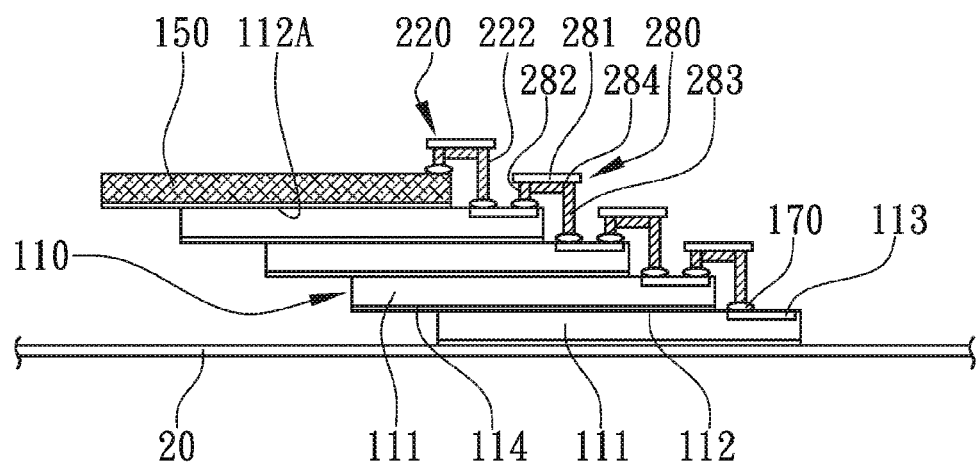
Figure 5C:
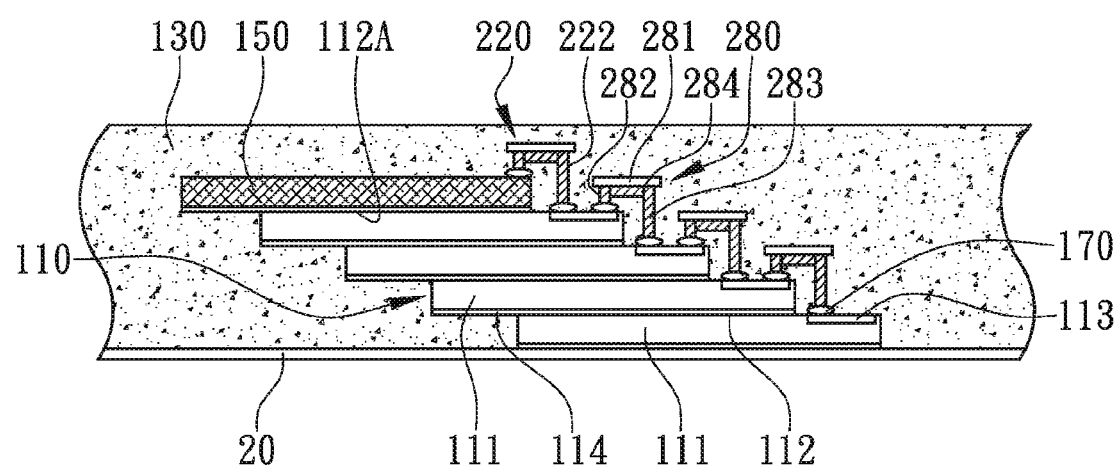
Figure 6:
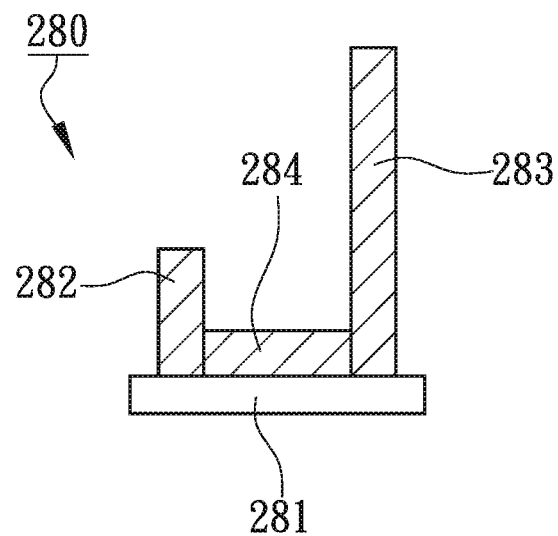
FIG. 6 is a cross-sectional view illustrating a second dummy flip chip utilized in the corresponding step of FIG. 5B according to the second embodiment of the present invention.

As shown in FIG. 5A, a chip stacked assembly 110 is disposed on a temporary carrier 20 by a pick-and-place process. The chip stacked assembly 110 comprises a plurality of chips 111 stacked on top of each other. Therein, each chip 111 has an active surface 112 and a plurality of electrodes 113 disposed on the active surface 112. The electrodes 113 of each of the chips 111 are not covered in the chip stacked assembly 110. An active surface 112A of one of the chips 111 is also not covered in the chip stacked assembly 110. After the step of providing the chip stacked assembly 110 and before the step of forming an encapsulant 130, the manufacturing method further comprises the step of disposing a spacer 150 on the active surface 112A.

As shown in FIG. 5B, the third dummy flip chip 220 and at least one of the second dummy flip chip 280 are disposed on the chip stacked assembly 110 by a flip-chip bonding process. The third flip-chip bumps 222 of the third dummy flip chip 220 are coupled to the electrodes 113 disposed on the active surface 112A. The second flip-chip bumps 282, 283 are coupled to the electrodes 113 of the rest of the active surfaces 112. As shown in FIG. 6, the second dummy flip chip 280 has a plurality of conductive traces 284 disposed on the second body 281 to electrically connect the second flip-chip bumps 282, 283 to each other.

As shown in FIG. 5C, an encapsulant 130 is formed over the temporary carrier 20 by a molding process. The encapsulant 150 encapsulates the chip stacked assembly 110, the third dummy flip chip 220 including the third flip-chip bumps 222, and the second dummy flip chip 280 including the second flip-chip bumps 282, 283. The encapsulant 130 may further encapsulate the spacer 150.

Figure 5D:
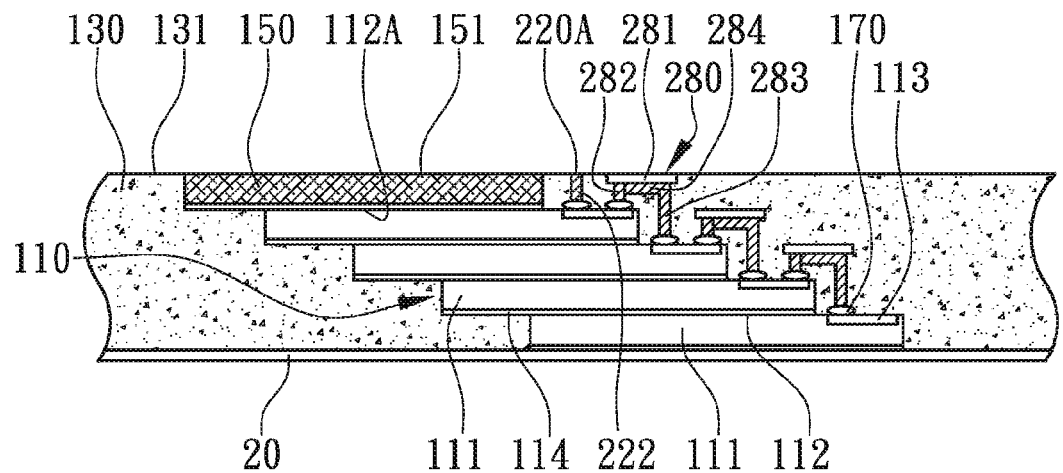

As shown in FIG. 5D, the encapsulant 130 may go through a grinding process. The encapsulant 130 may have a planar surface 131 adjacent to the active surface 112A after the grinding process. The third body 221 of the third dummy flip chip 220 may be removed completely. The third flip-chip bumps 222 may each have bonding surface 220A exposed through the planar surface 131. After grinding the encapsulant 130, the spacer 150 may have a ground surface 151 coplanar to the planar surface 131.

Figure 5E:
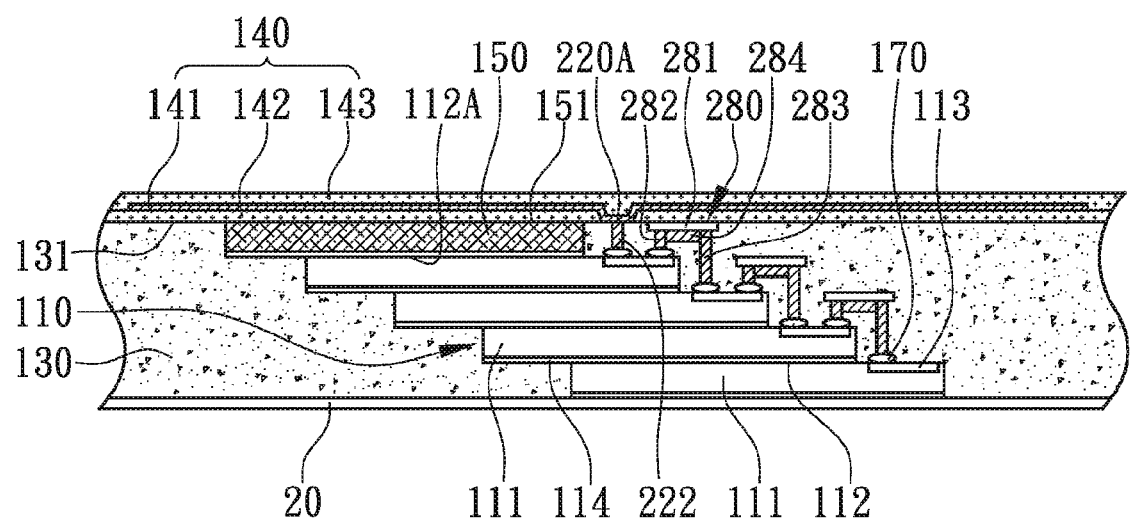

As shown in FIG. 5E, a redistribution layer 140 is disposed on the planar surface 131. The redistribution layer 140 includes a plurality of fan out circuits 141 electrically connected to the bonding surfaces 220A of the third flip-chip bumps 222. The redistribution layer 140 may further include a first passivation layer 142 and a second passivation layer 143 disposed on the first passivation layer 142. The first passivation layer 142 is formed over the planar surface 131, and the fan out circuits 141 are disposed between the first passivation layer 142 and the second passivation layer 143. The first passivation layer 142 further covers the ground surface 151.

After the step of disposing the redistribution layer 140, the manufacturing process further comprises the step of coupling a plurality of external terminals 160 onto the redistribution wiring mechanism 140 to electrically connect to the fan out circuits 141.

The temporary plate 20 may be removed. And, a singulation process may be performed. A plurality of individual fan out multi-chip stacked packages 200 shown in FIG. 4 are manufactured.

A thin fan out multi-chip stacked package 200 is disclosed. The shape and the height of the third pillar bumps 222 and the second flip-chip bumps 282, 283 are predesigned and fabricated to electrical connect the chips 111 to each other and the redistribution layer 140. Unlike the conventional wire bonding process where the wire loop becomes longer and more vulnerable to wire sweeping.

Figure 7:
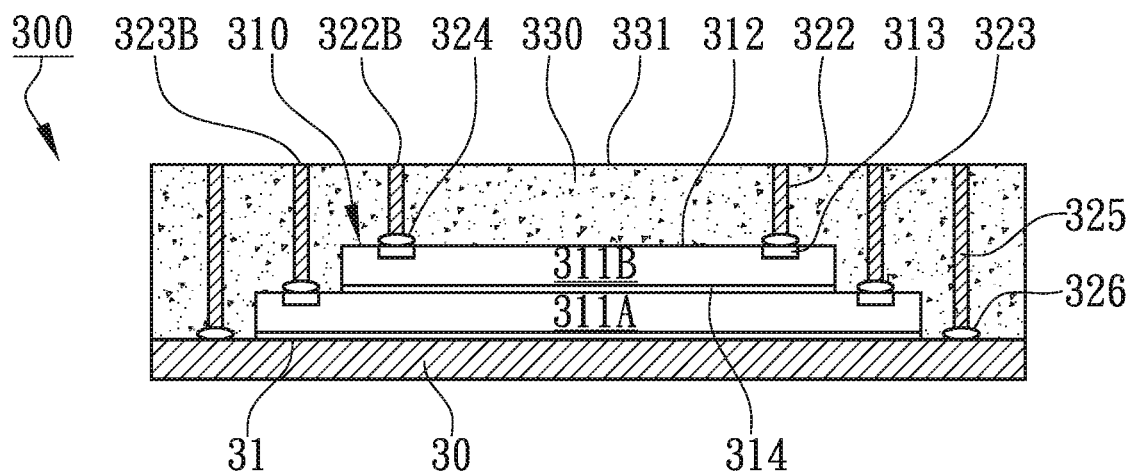
FIG. 7 is a cross-sectional view of another multi-chip stacked package according to the third embodiment of the present invention.
Figure 8A:
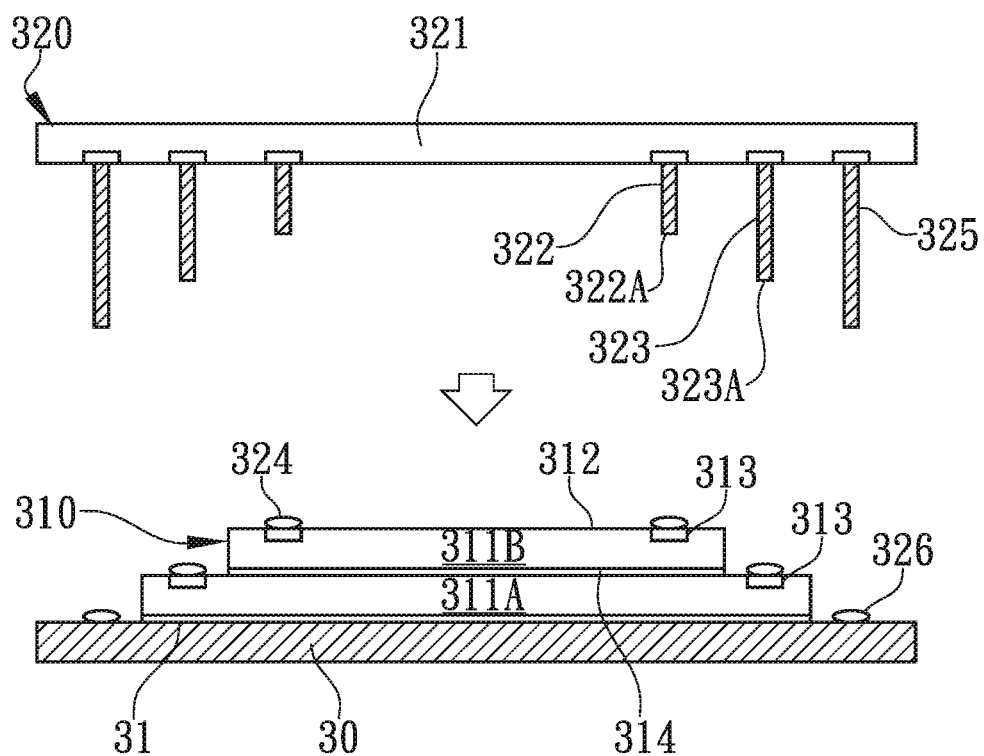
FIGS. 8A to 8B are cross-sectional views illustrating the components shown in a flip-chip bonding process of manufacturing the multi-chip stacked package before and after the disposition of a dummy flip chip according to the third embodiment of the present invention.
Figure 8B:
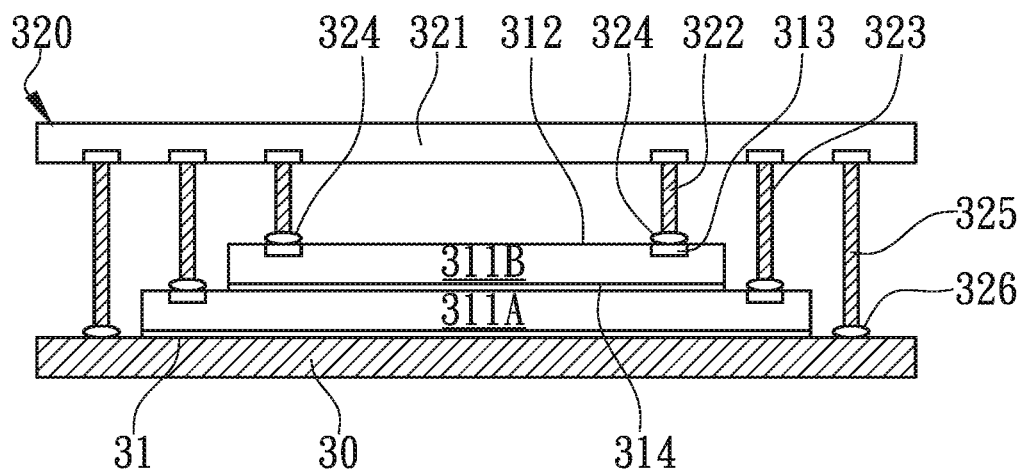

According to the third embodiment of the present invention, a cross-sectional view of a multi-chip stacked package 300 is illustrated in FIG. 7. FIG. 8A to FIG. 8B illustrate the cross-sectional views a flip-chip bonding process a dummy flip chip 320. The corresponding components with the same names, functions, and numbers as the first embodiment are followed and are no longer described for brevity. A multi-chip stacked package 300 comprises a chip stacked assembly 310, a plurality of flip-chip bumps 322, 323 separated from a dummy flip chip 320 and an encapsulant 330.

As shown in FIG. 7, the chip stacked assembly 310 comprises a plurality of stacked chips 311A, 311B which are disposed on a carrier plane 31 provided by a carrier 30. The carrier 30 may be a heat spreader, a dummy chip, or a film. For example, the carrier 30 may be a metal heat spreader. The carrier 30 may be kept or removed in the final multi-chip stacked package 300. For 3D Package-On-Package applications, the carrier 30 may be removed. For packages with high heat dissipation demand, the carrier 30 may be kept to function as a heat spreader. Each of the chips 311A, 311B has an active surface 312. A electrodes 313 are correspondingly disposed on the active surfaces 312. The electrodes 313 are not covered in the chip stacked assembly 310. The heights of the electrodes 313 on the carrier plane 31 corresponds to the heights of the chips 311A, 311B. A die-attach layer 314 is disposed between the chips 311A, 311B.

As shown in FIG. 7, the flip-chip bumps 322, 323 of the dummy flip chip 320 have a plurality of first terminals 322A, 323A. Therein, the first terminals 322A, 323A are coupled to the electrodes 313 of the chips 311A, 311B by a plurality of solder paste 324. The flip-chip bumps 322, 323 include a plurality of conductive pillars having a height difference between rows of the flip-chip bumps 322, 323. Therein, the height difference is approximately equal to a unit thickness of the stacked chips 311A, 311B. For example, the flip-chip bumps 323 has a height greater than the height of the flip-chip bumps 322. In the present embodiment, the unit thickness is the sum of the thickness of the chip 311A and the thickness of the die-attach layer 314. The dummy flip chip 320 may further include a plurality of spacing bumps 325 coupled to the carrier 30 by solder paste 326.

As shown in FIG. 7, the encapsulant 330 encapsulates the chip stacked assembly 310 and the flip-chip bumps 322, 323. A surface 331 of the encapsulant 330 is formed by completely removing the body 321 of the dummy flip chip 320. a plurality of second terminals 322B, 323B of the remaining flip-chip bumps 322, 322 are exposed from the surface 331 to make a multi-chip package without conventional wiring substrate.

As shown in FIG. 8A and FIG. 8B, the dummy flip chip 320 as disclosed in the present invention may be implemented in the multi-chip stacked package 300. The dummy flip chip 320 includes a body 321 and a plurality of flip-chip bumps 322, 323 extruded from the body 321. The body 321 is chosen from the group consisting of a dummy chip and a metal plate. The length difference among a plurality of rows of the flip-chip bumps 322, 323 matches to a chip-attached unit thickness of the stacked chips 311A, 311B.

The above description of embodiments of this invention is intended to be illustrative but not limited. Other embodiments of this invention may be obvious to those skilled in the art in view of the above disclosure which still may be covered by and within the scope of the present invention even with any modifications, equivalent variations, and adaptations.

What is claimed is:

1. A fan out multi-chip stacked package comprising:
a plurality of chips stacked over each other, at least one electrode of each of the plurality of chips and an active surface of a top chip being exposed after stacking of the plurality of chips;
a plurality of flip-chip bumps, each coupled to an electrode of a chip of the plurality of chips, each of the plurality of flip-chip bumps being a part of a dummy flip chip of at least one dummy flip chip;
an encapsulant encapsulating the plurality of chips and the plurality of flip-chip bumps, wherein a part of the encapsulant and a body of one of the at least one dummy flip chip is removed during a grinding process to form a planar surface of the encapsulant; and
a redistribution layer disposed on the planar surface, wherein the redistribution layer comprises a plurality of fan out circuits electrically coupled to the plurality of flip-chip bumps.

2. The package as claimed in claim 1, wherein the redistribution layer comprises a first passivation layer and a second passivation layer on the first passivation layer, wherein the first passivation layer is formed on the planar surface and the fan out circuits are disposed between the first passivation layer and the second passivation layer.

3. The package as claimed in claim 1, wherein the chips are stair-like staggered stacked and the electrodes are bonding pads disposed on a peripheral area of an active surface of a corresponding chip.

4. The package as claimed in claim 1, further comprising a spacer disposed on the active surface of the top chip.

5. The package as claimed in claim 1, wherein a height of a dummy flip chip bump of a dummy flip chip is different from a height of another flip chip bump of the dummy flip chip disposed on another row.

6. The package as claimed in claim 1, wherein the at least one dummy flip chip is a plurality of dummy flip chips, a first dummy flip chip of the plurality of dummy flip chips includes the body removed during the grinding process and flip chip bumps coupled to electrodes of the top chip, and each of remaining dummy flip chips of the plurality of dummy flip chips includes a body encapsulated by the encapsulant and flip chip bumps coupled to electrode of chips other than the top chip.

7. The package as claimed in claim 1, further comprises a carrier plane disposed under the plurality of chips, the carrier plane configured to form a heat spreader and is electrically connected to at least one of the plurality of flip chip bumps.

8. The package as claimed in claim 1, wherein the plurality of flip-chip bumps are formed through electroplating, coating, forming of copper pillar, or wire bonding.

9. The package as claimed in claim 2, further comprising a plurality of external terminals electrically connected to the fan out circuits.

10. The package as claimed in claim 4, wherein the spacer is a plate having a ground surface coplanar to the planar surface, wherein the first passivation layer is further disposed on the ground surface.

11. A manufacturing method of a fan out multi-chip stacked package, comprising:
- disposing a chip stacked assembly on a temporary carrier, the chip stacked assembly comprises a plurality of chips, each of the plurality of chips having an active surface and at least one electrode disposed on the active surface, the electrodes of the chips and an active surface of a top chip being exposed on the chip stacked assembly;
- disposing at least one dummy flip chip to the chip stacked assembly, wherein the at least one dummy flip chip includes a plurality of flip-chip bumps coupled to the electrodes;
- forming an encapsulant over the temporary carrier, wherein the encapsulant encapsulates the chip stacked assembly and the plurality of flip-chip bumps of the at least one dummy flip chip;
- grinding the encapsulant to form a planar surface of the encapsulant, a body of a dummy flip chip of the at least one dummy flip chip is removed, and at least one part of the plurality of flip-chip bumps each has a corresponding bonding surface exposed from and coplanar to the planar surface;
- disposing a redistribution layer on the planar surface, the redistribution layer having a plurality of fan out circuits electrically connected to the bonding surface; and
- removing the temporary carrier.

12. The method as claimed in claim 11, wherein disposing the redistribution layer on the planar surface comprises:
- forming a first passivation layer on the planar surface;
- forming the fan out circuits on the first passivation layer; and
- forming a second passivation layer on the first passivation layer and the fan out circuits.

13. The method as claimed in claim 11, further comprising:
- forming the chip stacked assembly by stacking the plurality of chips on each other to form a stair-like staggered stacked structure.

14. The method as claimed in claim 11, further comprising:
- disposing a spacer on the active surface of the top chip.

15. The method as claimed in claim 11, wherein flip-chip bumps of a dummy flip chip are configured to form a plurality of rows, the flip-chip bumps of different rows have different height from each other.

16. The method as claimed in claim 11, wherein disposing the at least one dummy flip chip to the chip stacked assembly comprises:
- disposing a plurality of dummy flip chips on the chip stacked assembly, a first dummy flip chip of the plurality of dummy flip chips includes the body removed during the grinding of the encapsulant and flip chip bumps coupled to electrodes of the top chip of the chip stacked assembly, and each of remaining dummy flip chips of the plurality of dummy flip chips includes a body encapsulated by the encapsulant and flip chip bumps coupled to electrode of chips other than the top chip.

17. The method as claimed in claim 11, wherein the plurality of flip-chip bumps are formed through electroplating, coating, forming of copper pillar, or wire bonding.

18. The method as claimed in claim 12, further comprising:
- bonding a plurality of external terminals on the redistribution layer, wherein the plurality of external terminals are electrically connected to the fan out circuits.

19. The method as claimed in claim 14, wherein grinding the encapsulant further includes grinding a part of the spacer to form a ground surface coplanar to the planar surface.

* * * * *